United States Patent [19]

Hatada et al.

[11] Patent Number: 4,959,590
[45] Date of Patent: Sep. 25, 1990

[54] LEAD CONNECTION STRUCTURE

[75] Inventors: Kenzo Hatada, Katano; Koichi Nagao, Chigasaki, both of Japan

[73] Assignee: Matsushita Electric Industrial Co., Ltd., Osaka, Japan

[21] Appl. No.: 943,198

[22] Filed: Dec. 18, 1986

[51] Int. Cl.⁵ .............................................. H05B 33/06
[52] U.S. Cl. ............................ 315/169.3; 228/180.2; 228/188; 313/512
[58] Field of Search ................ 315/169.3; 357/70, 72; 313/512; 228/180.2, 188

[56] References Cited

U.S. PATENT DOCUMENTS

| | | | |
|---|---|---|---|
| 3,133,221 | 5/1964 | Knochel et al. | 313/512 |
| 4,295,711 | 10/1981 | Tanaka et al. | 350/334 |
| 4,494,688 | 1/1985 | Hatada et al. | 228/180.2 |

FOREIGN PATENT DOCUMENTS

60-121789 6/1985 Japan .

Primary Examiner—Eugene R. LaRoche
Attorney, Agent, or Firm—Wenderoth, Lind & Ponack

[57] ABSTRACT

Lead connection in a structure is provided by leads disposed against electrodes of wiring board through resin, which resin is then stiffened by the application of light. Accordingly, an electrical and a mechanical connection of the leads and the electrondes is accomplished.

11 Claims, 7 Drawing Sheets

LEAD CONNECTION STRUCTURE

BACKGROUND OF THE INVENTION

This invention relates to a lead connection structure, and more particularly to a lead connection structure which is capable of, for example, connecting electrodes of a semiconductor device to the wiring pattern of a wiring board including an electroluminescence display panel and a liquid crystal display panel.

Recently, many types of equipment have been employed in which an image display, character display is realized by the use of a liquid crystal display panel, an electroluminescence display panel. These display panels have a characterizing feature in that they are thinner. To display characters having high clarity in display panels, it is necessary to increase the number of scanning lines formed in the display panels. This is indispensable to increase the value of display panels, providing a display panel exhibiting performance characteristics close to that of a cathode ray tube display. However, if the number of scanning lines is increased, the number of electrodes of a display panel is necessarily increased. Furthermore, if the number of electrodes is increased, the number of LSIs which are used for driving a display panel is necessarily increased.

Therefore, when the performance of a liquid crystal display panel or an electroluminescence panel is to be improved, the number of connections between the LSIs for driving the display panel and the electrodes of the display panel is necessarily increased, so that reliability of the display panel may be decreased and the manufacturing cost is considerably increased. These reasons represent obstacles in the practical use of a display panel.

Incidentally, relevant methods of manufacturing improved display panels are disclosed in U.S. Pat. No. 4,494,688 (Patented Jan. 22, 1985) by Hatada et al., U.S. Ser. No. 757,856 (Filed July 22, 1985) by Hatada et al., and U.S. Ser. No. 763,787 (filed Aug. 8, 1985) by Hatada.

SUMMARY OF THE INVENTION

It is a primary object of this invention to provide a lead connecting structure which is capable of eliminating the above-stated disadvantages.

In the present invention, a semiconductor device is mounted directly on a film with leads, and the leads are connected to electrodes of wiring board, e.g., a display panel. Therefore, the number of connections is reduced to increase reliability and to reduce the manufacturing cost associated with mounting the semiconductor device.

These and other objects are accomplished by a lead connection structure according to the present invention, which structure includes a substrate on which at least one electrode is disposed, at least one lead which abuts the electrode so as to be electrically connected to the electrode, and insulating resin disposed between the electrode and the lead for mechanically connecting the electrode and lead. The resin is stiffened by the application of light thereto.

In a specific embodiment, a connecting area of the electrode and the lead may be covered by the resin. The lead may comprise a flexible base and a conductive pattern which is disposed on the flexible base. One end of the lead may be connected to the electrode, and the other end of the lead is connected to an electrode of a semiconductor device.

According to the present invention as described herein, the following benefits, among others, are obtained.

(1) Since insulating resin is used for providing the connection, electric leakage does not occur between adjacent leads, adjacent electrodes so that the pitch of electrodes, leads may be reduced as much as possible. That is, a high density connection is possible.

(2) Since the connection is provided by simply using insulating resin which is stiffened upon the application of light, the cost associated with maintaining the leads is considerably reduced.

(3) Since the number of connections is small, the reliability of the connections is high.

(4) Since the number of connections is small, the area required for the connections is also small so that mounting space may be reduced.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

A first embodiment of the invention is described with reference to FIG. 1. A liquid crystal display (LCD) panel is designated by numeral 10. The panel 10 may be an electroluminescence (EL) panel, and includes base 12 and electrodes 14 formed on base 12.

Semiconductor devices to be connected to electrodes 14 to drive the LCD panel are designated by numeral 16. Although, in FIG. 1, only one semiconductor device 16 and only one electrode 14 which correspond to device 16 are shown, many semiconductor devices 16 and electrodes 14 are actually provided. The semiconductor device 16 may be an IC or LSI and has electrodes 18.

A film tape, which is used for connecting semiconductor device 16 to LCD panel 10, is designated by numeral 20. The film tape 20 comprises base 22 and conductive patterns 24 formed on base 22. The base 22 is made of polyimid or epoxy resin including glass. The conductive pattern 24 is made by subjecting Cu foil to Sn plating treatment and is attached to the surface of base 22 with adhesive. The base 22 has apertures 26 at positions where semiconductor devices 16 are disposed. End portions 24a of conductive patterns 24 serving as leads extend into apertures 26, and are electrically connected to electrodes 18 of semiconductor device 16. The other end portions 24b of conductive patterns 24 are electrically connected to end portions of electrodes 14 of the LCD panel 10 with resin 28 used as an adhesive which is stiffened by the application of light thereto.

The electrode 18 of semiconductor device 16 includes a metal projection or metal bump made of Au, Cu, or solder and has a height of 10-30 μm, which bump is formed on an electrode pad of semiconductor device 16. The bump 18 is connected to end portion 24a of conductive pattern 24 with an Au-Sn alloy connection. Resin 30 for protecting semiconductor device 16 is deposited on the surface of semiconductor device 16 through aperture 26 so that the reliability of the attachment of semiconductor device 16 is improved.

Furthermore, the connection of conductive pattern 24b to electrode or wiring pattern 14 by resin 28 is carried out by pressing one of the conductive pattern 24b and electrode 14 to the other, and stiffening resin 28 by applying light thereto to complete the fixing operation. The resin 28 may be painted or attached to one of the conductive pattern 24b and electrode 14 prior to performing the pressing process.

Although the stiffening of resin 28 can be carried out by applying heat thereto, it is carried out in this embodiment by applying light, such as ultra violet rays or far ultra violet rays, thereto.

The resin 28 may be adhesive in which conductive powders, fibers are dispersed, and a combination type, e.g., requiring light stiffening and natural stiffening or light stiffening and heat stiffening.

Figure 1:
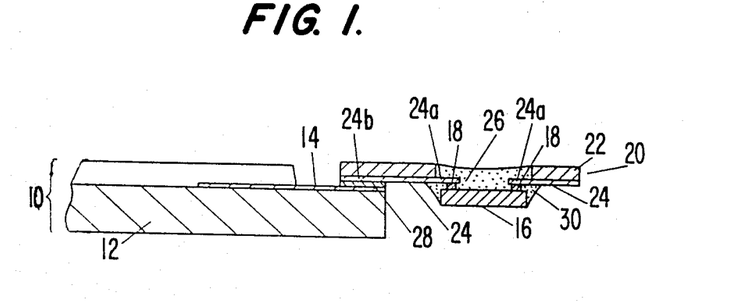
FIG. 1 is a sectional view of a lead connection structure according to a first embodiment of the invention.
Figure 2:
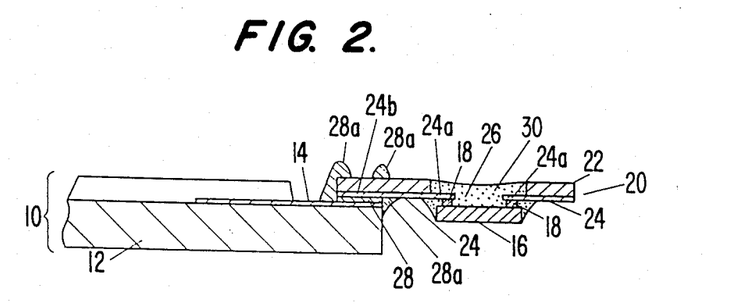
FIG. 2 is a sectional view of a modification of the embodiment of FIG. 1.

FIG. 2 shows one modification of the embodiment of FIG. 1. In FIG. 2, resin 28 is disposed at a peripheral portion of the connection, as shown by numeral 28a, to obtain higher reliability. That is, even when unnecessary force is applied to the connection in a direction that acts to remove conductive pattern 24b from electrode 14, the force is resisted by resin 28a. The arrangement including resin 28a is readily realized by simply increasing the quantity of resin 28 which is disposed between conductive pattern 24a and electrode 14.

FIGS. 3A through 3D show steps of the method according to the present invention.

Figure 3A:
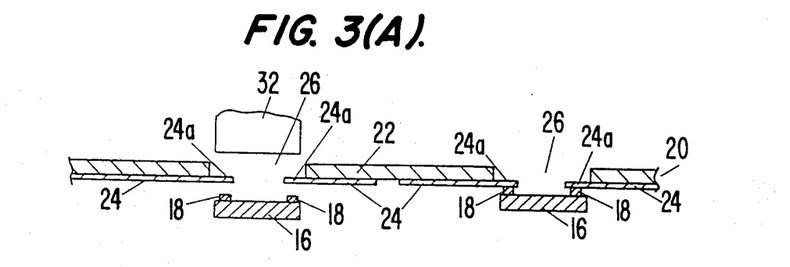
FIGS. 3A through 3D are sectional views illustrating a method of making the structure of FIG. 2.

The film base 22 is polyimid film or epoxy with glass film and is several tens of meters long and 35 mm wide. The base 22 has sprocket holes at both side portions in the widthwise direction thereof, which holes are used for movement of film 20. The film base 22 has apertures 26 and Cu foil with Sn plating serving as leads 24. On the other hand, metal bumps 18 are formed on semiconductor device 16 in advance.

As shown in FIG. 3A, leads 24a of film 20 are positioned opposite bumps 18 of semiconductor device 16 and bumps 18 are connected to leads 24 by pressing and heating them with a bonding tool 32.

Figure 3B:
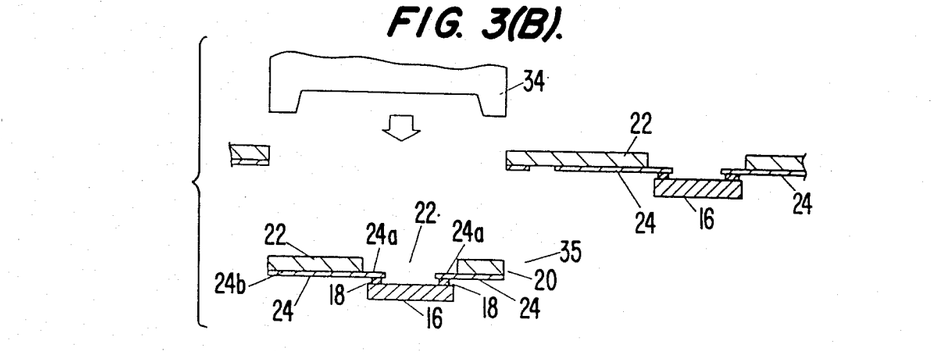

Thereafter, an electrical measurement of them is made. Then, as shown in FIG. 3B, film 20 is cut with a cutting die 34 so that unit 35 is removed from film 20. The unit 35 includes film 20 and semiconductor device 16 which is attached to film 20.

Figure 3C:
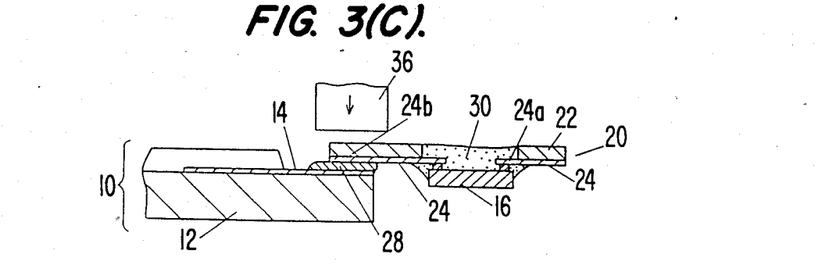
Figure 3D:
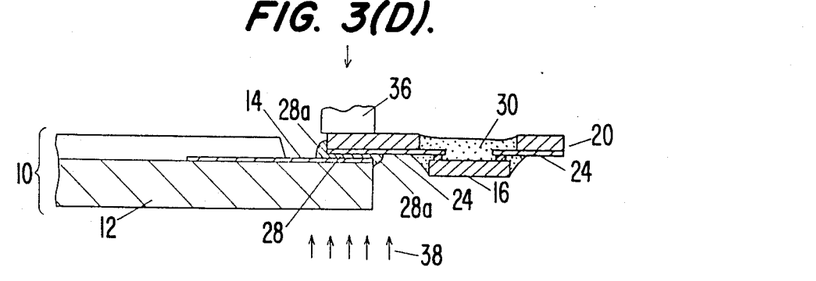

Then, as shown in FIG. 3C, resin 28 is painted on lead 24b or on electrode 14 and lead 24b is positioned opposite electrode 14 with resin 28 therebetween. Thereafter, pressing tool 36 is lowered to and pressed against lead 24 portion and ultra violet rays or far ultra violet rays 38 are applied to the portion as shown in FIG. 3D. Accordingly, resin 28 is expanded and stiffened. After stiffening is completed, the light application is ceased and tool 36 is raised.

If the base 12 of the LCD panel 10 is transparent, the application of light may be performed from a lower surface of LCD panel 10. If base 12 is oblique, light may be simply applied to exposed portion of resin 28 and unstiffened resin may be stiffened over a period of time, i.e. by natural stiffening or by the application of heat.

If the quantity of resin 28 is increased, the structure shown in FIG. 2 may be obtained.

As a light stiffening type resin 28, insulating resin from an acrylate group, epoxy group, etc. can be used. The conditions under which the resin 28 is light stiffened are: a high pressure mercury lamp is used as a light source and stiffening is completed for 10-30 seconds by light application of 10mW/cm.

The resin 28 may be temporarily stiffened under the application of light and thereafter, completely stiffened by natural stiffening or by the application of heat. The heat application may be carried out at temperature of 100-150° C. under pressure applied for 5-30 minutes or with such pressure application removed.

Figure 4:
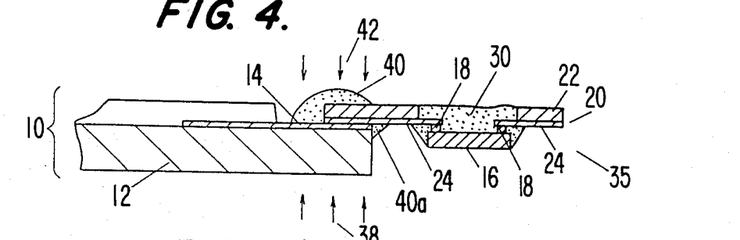
FIG. 4 is a sectional view of a second embodiment of the invention.

FIG. 4 shows a second embodiment of the invention. The structure shown in FIG. 4 is similar to that shown in FIG. 1. The difference is that a connection area connecting lead 24 and electrode 14 is fully covered by a light stiffening type resin 40 which is the same as resin 28. The resin 40 is stiffened by the application of light 42. The resin 40 is also disposed between electrode 14 and lead 24 to thereby produce resin portion 40a.

Figure 5A:
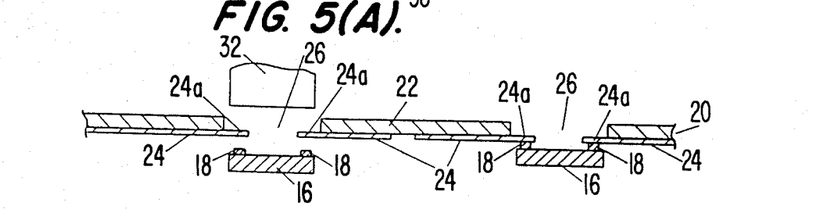
FIGS. 5A through 5D are sectional views illustrating a method of making the structure of FIG. 4.
Figure 5B:
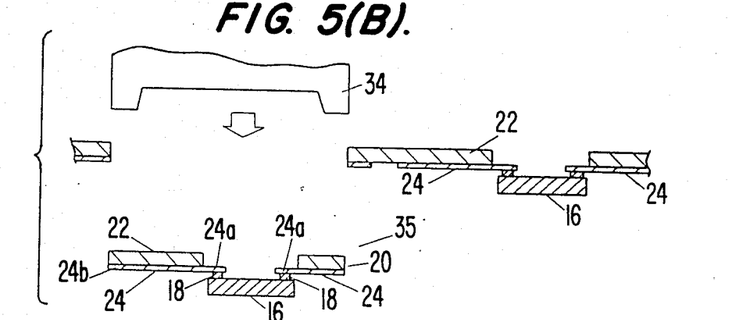
Figure 5C:
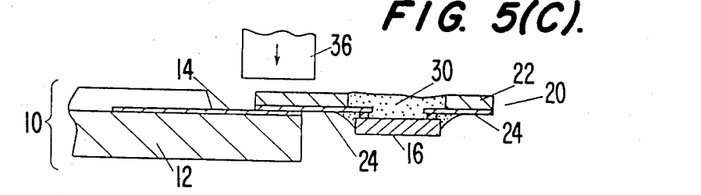

The structure shown in FIG. 4 is obtained by performing the steps illustrated in FIGS. 5A through 5D. As is apparent from a comparison of FIGS. 5 and 2, the steps illustrated in FIGS. 5A through 5C are similar to those illustrated in FIGS. 3A through 3C.

Figure 5D:
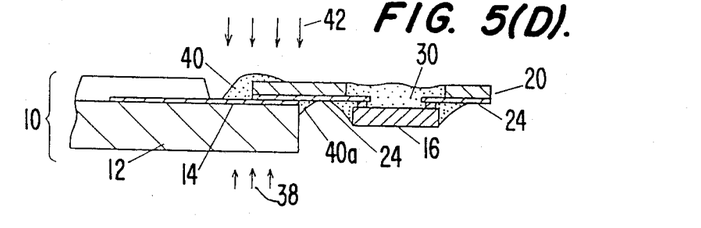

After tool 36 is lowered to and pressed against the connection area connecting lead 24 and electrode 14, resin 40 is applied to the connection area in such a manner that the area is covered by resin 40. Then, light 42, 38 is applied thereto so that resin 40 is stiffened to improve the reliability of the connection.

Figure 6:
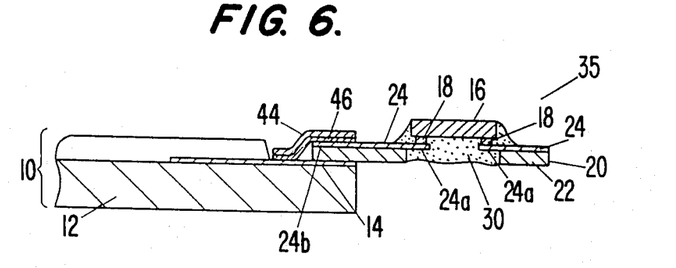
FIG. 6 is a sectional view of a third embodiment of the invention.

FIG. 6 shows a third embodiment of the invention. As is apparent from a comparison of FIGS. 6 and 4, in FIG. 6, unit 35 is disposed up side down as compared with the structure of FIG. 3. An electric connection between lead 24 and electrode 14 is provided by flexible wiring board 44, and particularly a conductive strip 46 formed on the lower surface of flexible wiring board 44. The flexible board 44 has a plurality of conductive strips 46 which correspond to leads 24 and electrodes 14. The pitch of adjacent strip 46 is the same as or narrower than that of adjacent electrodes 14 or adjacent leads 24. The flexible board 44 comprises a flexible film base having a thickness of several 100-several 100 μm.

The strips 46 are pressed against leads 24 and electrodes 14. If adhesive resin (not shown) is disposed on film base 44, the base 44 is fixed to base 22 so that a complete connection of lead 24 to electrode 14 is accomplished. In this embodiment, since flexible board 44 is used for providing an electrical connection, even if film base 22 is expanded or twisted due to a temperature change, such twist, etc. can be accommodated for by the flexibility of board 44.

Figure 7A:
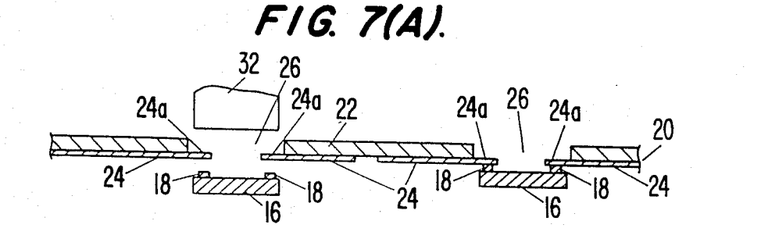
FIGS. 7A through 7E are sectional views illustrating a method of making the structure of FIG. 6.
Figure 7B:
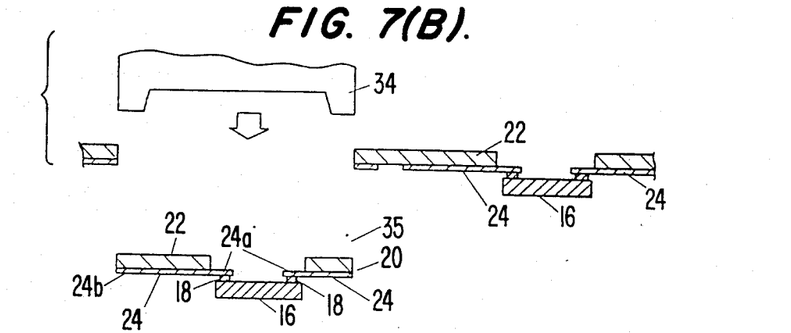
Figure 7C:
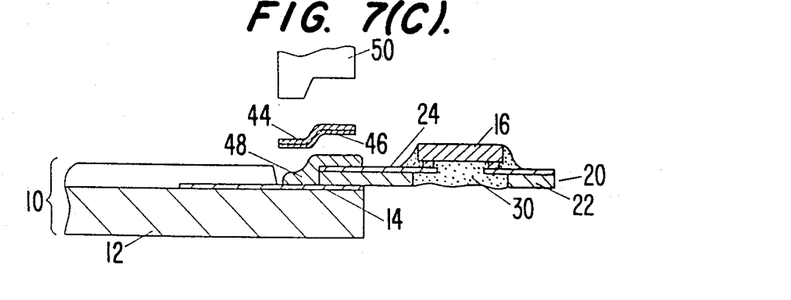

The structure shown in FIG. 6 is obtained by performing the steps illustrated in FIGS. 7A through 7E. The steps illustrated in FIGS. 7A, 7B are the same as those illustrated in FIGS. 3A, 3B. After the step of FIG. 7B is finished, leads 24 are positioned opposite electrodes 14, and light stiffening resin 48 (which is the same material as resin 28, 40) is painted on electrodes 14 and leads 24 as shown in FIG. 7C.

Figure 7D:
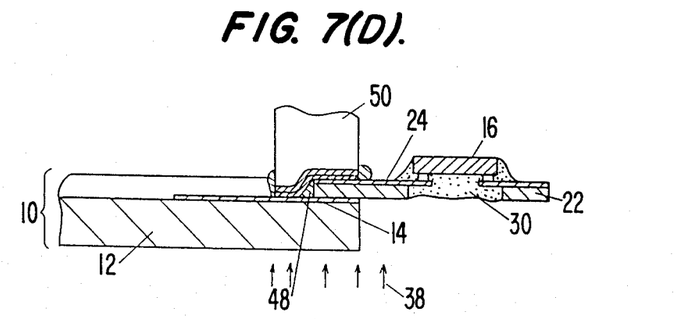
Figure 7E:
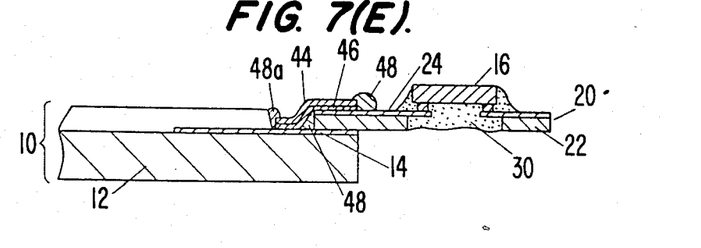

Then, the flexible board 44 having strips 46 is positioned opposite leads 24 and electrodes 14 and is pressed by pressing tool 50 against leads 24 and electrode 14, and more precisely against film base 22 and base 12, and light 38 is applied to resin 48, so that resin 48 is stiffened as shown in FIG. 7D. Thereafter, the light application 38 is ceased and tool 50 is raised so that the structure shown in FIG. 7E is obtained. An extra portion of resin 48 is designated by numeral 48a.

Figure 8:
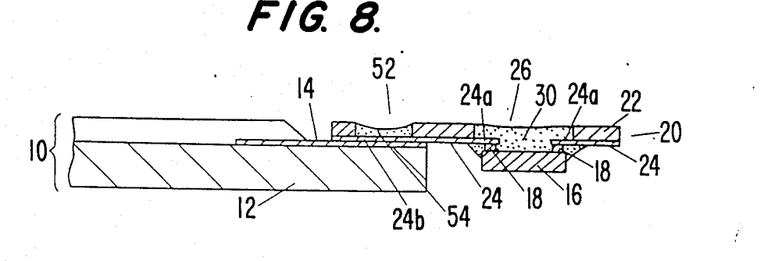
FIG. 8 is a sectional view of a fourth embodiment of the invention.

FIG. 8 shows a fourth embodiment of the invention. The structure shown in FIG. 8 is similar to that shown in FIGS. 1, 2, 4. The difference lies in the structure of film 20. That is, there is an aperture 52 at an end portion of film base 22, through which aperture 52 a plurality of leads 24 are exposed. Therefore, exposed portions of leads 24 are directly pressed against electrodes 14 so that leads 24 are connected to electrodes 14 by resin stated before and the reliability of their connection is improved. The aperture 52 is filled with resin 54 which is used for protecting leads 24 and electrodes 14.

In the structure shown in FIG. 8, film base 22 is not present at the position above the connection area of leads 24 and electrode 14. Therefore, even if film 20, glass base 12 are transformed by thermal expansion, etc. and thus a force is applied thereto, such force can be accommodated by flexible leads 24.

Figure 9:
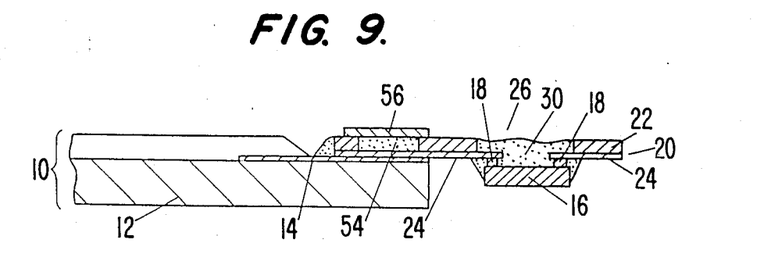
FIG. 9 is a sectional view of a fifth embodiment of the invention.

FIG. 9 shows a modification of the structure shown in FIG. 8. In this structure, aperture 52 is completely closed by a flexible plate 56 after it is filled with resin 54 so that leads 24 at the connection area are completely prevented from being exposed to the outside atmosphere.

Figure 10A:
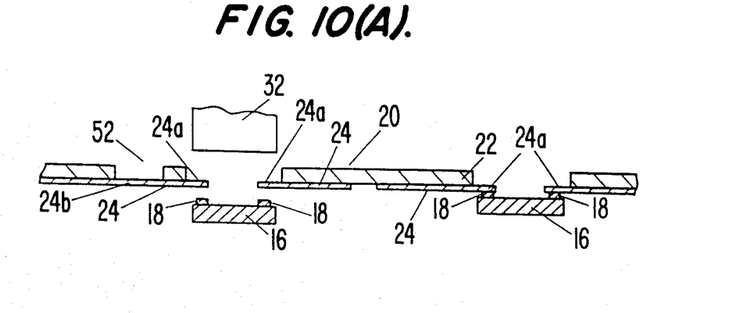
FIGS. 10A through 10C are sectional views illustrating a method of making the structures of FIGS. 8, 9.
Figure 10B:
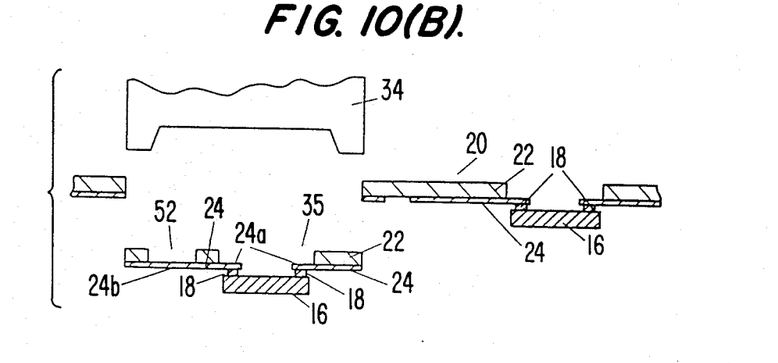
Figure 10C:
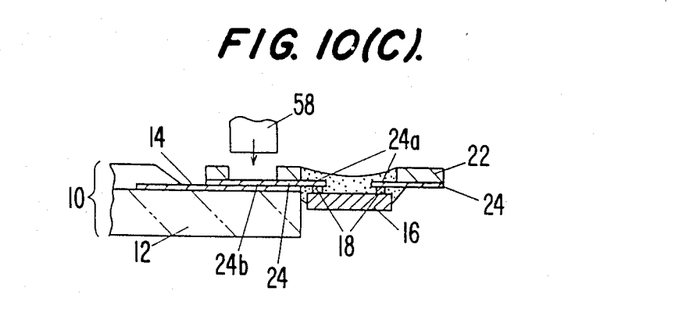

The structures shown in FIGS. 8 and 9 are obtained by performing the steps illustrated in FIGS. 10A through 10C. The steps of FIGS. 10A, 10B are almost the same as those of FIGS. 3A, 3B. In FIG. 10C, resin (not shown) is disposed on electrodes 14 or on leads 24 and leads 24 are pressed against electrodes 14 by pressing tool 58 and light or heat is applied to the resin so that the resin is stiffened. After stiffening of the resin is finished, light or heat application is ceased and tool 58 is raised. Then, aperture 52 is filled with resin 54 and with respect to the embodiment of FIG. 9, plate 56 is provided.

In the above-described embodiments, a display panel having a base made of transparent glass plate is connected to leads. The panel may simply be insulating board, or simple wiring board such as ceramic board, resin board, etc. Such simple wiring board may be connected to leads in the same manner as stated above. In this case, the resin employed may be stiffened by the application of light from a peripheral portion of a pressure tool.

Figure 11:
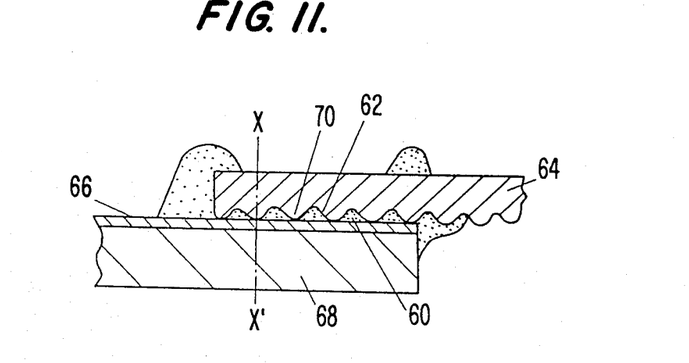
FIG. 11 is a sectional view of a sixth embodiment of the invention.

To form the connection of a simple wiring board and leads, according to the present invention, light stiffening type insulating resin is disposed between electrodes on a wiring board and the leads, and the electrodes and leads are pressed against one another, and the resin is stiffened by the application of light. In this case, as shown in FIG. 11, the resin 60 is disposed in recesses 62 of leads 64 and the leads 64 are connected to electrodes or wiring patterns 66 of a wiring board 68 by at least resin 60 which remains in recesses 62. Furthermore, as is apparent from FIG. 12, resin 60a is disposed between leads 64 and side surfaces of leads 64 are fixed to wiring board 68. Electrical connection is accomplished through the contact of projection portion 70 of lead 64 to electrode 66.

Figure 12:
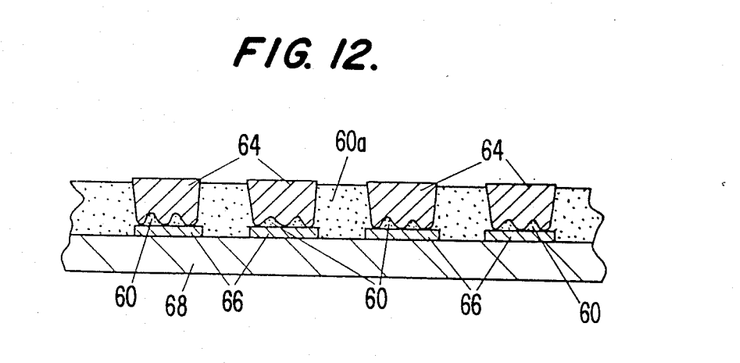
FIG. 12 is a sectional view taken along the line X—X' of FIG. 11.

In the above-described embodiment, recesses 62 are formed in leads 64 and filled with resin 60. Therefore, a connection having a high connection strength and high reliability is accomplished. Electrical connection is accomplished by pressing projection portion 70 against electrode 66. The recesses 60 may be formed on electrode 66 and board 68 instead of lead 64.

While specific embodiments of the invention have been illustrated and described herein, it is realized that other modifications and changes will occur to those skilled in the art. It is therefore to be understood that the appended claims are intended to cover all modification and changes as fall within the true spirit and scope of the invention.

We claim:

1. A lead connection structure comprising:
   a base substrate on which at least one electrode is disposed;
   film tape comprising a flexible base and a pattern of electrically conductive material disposed on said flexible base, said film tape disposed against each said at least one electrode with said conductive material in an electrically conductive relationship with said at least one electrode, a connecting area being defined beside the location at which said film tape is disposed against said at least one electrode; and
   insulating resin disposed between said at least one electrode and said electrically conductive material and covering said connecting area, said insulating resin having been stiffened by the application of light thereto, and said film tape being mechanically coupled to said base substrate due to the application of light to the insulating resin disposed between said at least electrode and said electrically conductive material and covering said connecting area.

2. A lead connection structure as claimed in claim 1, and further comprising a semiconductor device having an electrode, said semiconductor device operatively connected to said base substrate through said at least one electrode and the film tape disposed thereagainst, one end of said pattern of electrically conductive material connected to said at least one electrode and the other end of said pattern of electrically conductive material connected to the electrode of said semiconductor device.

3. A lead connection structure comprising:
   a display panel having a plurality of electrodes thereon;
   a plurality of leads operatively connected to a respective one of the electrodes of said display panel;
   a flexible board disposed between said display panel and said plurality of leads, said flexible board including a plurality of conductive strips respectively electrically connecting said plurality of leads to a respective one of the electrodes of said display panel, said conductive strips overlying said electrodes and said leads at a contacting area defined therebetween, and disposed against said electrodes and said leads so as to be in an electrically conductive relationship with said electrodes and said leads, a connecting area being defined beside said contacting area; and insulating resin disposed at said contacting area between said conductive strips and said electrodes and between said conductive strips and said leads, and said insulating resin covering said connecting area, said insulating resin having been stiffened by the application of light thereto, and said electrodes being mechanically coupled with said leads by said insulating resin due to the application of light to said insulating resin.

4. A lead connection structure comprising:

a base substrate on which at least one electrode is disposed;

a film tape having at least one lead thereon respectively disposed against said at least one electrode so as to be directly electrically connected therewith, said film tape having an aperture extending therethrough at a location at which said at least one lead is respectively connected to said at least one electrode, and a connecting area being defined beside the location at which said at least one lead is respectively connected to said at least one electrode; and insulating resin disposed between said at least one electrode and said at least one lead, over said connecting area and in said aperture, said insulating resin mechanically fixing said film tape to said base substrate.

5. A lead connection structure as claimed in claim 4, and further comprising a flexible plate extending over said aperture opposite said at least one lead.

6. A lead connection structure comprising:

a base substrate on which an electrode is disposed;

a lead, said electrode and said lead having a contacting surface in which a plurality of recesses extend, said contacting surface contacting the other of said electrode and said lead so as to be directly electrically connected thereto, a connecting area being defined beside the location at which said contacting surface contacts the other of said electrode and said lead; and insulating resin disposed over said connecting area and in said recesses, said insulating resin having been stiffened by the application of light thereto, and said contacting surface being against said other of said lead and said electrode so as to be in an electrically conductive relationship therewith.

7. A lead connection structure as claimed in claim 6, wherein said at least one electrode has said contacting surface.

8. A lead connection structure as claimed in claim 6, wherein said at least one lead has said contacting surface.

9. A lead connection structure comprising:

a base substrate having a plurality of electrodes thereon;

film tape including a plurality of leads disposed on only one of two opposing surfaces of said film tape, the other of said two opposing surfaces disposed against said electrodes;

conductive strips extending between the leads of said flexible tape and the electrodes of said base substrate and being against said leads and said electrodes so as to be in an electrically conductive relationship therewith, a connecting area being defined beside the location at which said conductive strips are against said leads and beside the location at which said conductive strips are against said electrode; and insulating resin disposed between said additional leads and the electrodes of said substrate and between said conductive strips and the leads of said flexible tape, and said insulating resin covering said connecting area, said insulating resin mechanically fixing said film tape to said base substrate.

10. A lead connection structure as claimed in claim 3, and further comprising a plurality of semiconductor devices operatively electrically connected to said plurality of leads.

11. A lead connection structure as claimed in claim 4, and further comprising a semiconductor device operatively electrically connected to each said at least one electrode, and wherein said film tape is disposed between said base substrate and each said semiconductor device.

* * * * *